(12) United States Patent
Shih et al.

(10) Patent No.: US 6,640,403 B2
(45) Date of Patent: Nov. 4, 2003

(54) METHOD FOR FORMING A DIELECTRIC-CONSTANT-ENCHANCED CAPACITOR

(75) Inventors: Wong-Cheng Shih, Hsin-Chu (TW); Lan Lin Chao, Taipei (TW); Tai-Bor Wu, Hsin-Chu (TW); Chich-Shang Chang, Pa-Te (TW)

(73) Assignee: Vanguard International Semiconductor Corporation (TW)

( * ) Notice: Subject to any disclaimer, the term of this patent is extended or adjusted under 35 U.S.C. 154(b) by 142 days.

(21) Appl. No.: 09/866,468

(22) Filed: May 29, 2001

(65) Prior Publication Data

US 2002/0012222 A1 Jan. 31, 2002

Related U.S. Application Data (63) Continuation-in-part of application No. 09/273,717, filed on Mar. 22, 1999, now abandoned.

(51) Int. Cl.[7] .................................................. H01G 7/00
(52) U.S. Cl. ........................... 29/25.41; 29/830; 29/831; 29/846
(58) Field of Search ............................... 29/25.41, 25.42, 29/846, 831, 830; 361/277, 278, 283.1, 283.3, 306.1, 306.3; 427/532, 535, 331

(56) References Cited

U.S. PATENT DOCUMENTS

| | | | | | |
|---|---|---|---|---|---|
| 4,437,139 A | * | 3/1984 | Howard | ....................... | 361/313 |
| 5,444,006 A | * | 8/1995 | Han et al. | .................... | 438/396 |
| 5,786,248 A | * | 7/1998 | Schuegraf | .................... | 438/240 |
| 5,835,677 A | * | 11/1998 | Li et al. | ...................... | 392/401 |
| 5,861,675 A | * | 1/1999 | Sasaki et al. | ............... | 257/764 |
| 6,303,972 B1 | * | 10/2001 | Agarwal | ..................... | 257/532 |

* cited by examiner

*Primary Examiner*—Carl J. Arbes
*Assistant Examiner*—Tai Nguyen (57) ABSTRACT

A method for forming a dielectric-constant-enhanced capacitor is provided. A wafer in a reaction chamber is provided, wherein said wafer comprises a first conductive layer. Then, a first dielectric layer is formed above said first conductive layer to prevent said first conductive layer from growing silicon oxide and to diminish leakage current. Next a precursor is transmitted to a vaporizer. Then said precursor is transformed to a gas and said gas is transmitted to said reaction chamber. Next, a second dielectric layer is deposited above said first dielectric layer. Then a heat treatment is proceeded and a second conductive layer is formed on said second dielectric layer.

20 Claims, 9 Drawing Sheets

| Precursor | Chemical Formula | State | Melting point(°C) | Evaporation Temperature(°C) | Decomposition temperature(°C) | Dissolvable organic solvent |
|---|---|---|---|---|---|---|
| Ti(O-iso-Pr)$_2$(DPM)$_2$ | Ti(C$_3$H$_7$O)$_2$(C$_{11}$H$_{19}$O$_2$)$_2$ | Solid | 168 | 130-240 | 270 | THF(C$_4$H$_8$O) |
| Ta(OEt)(O-iso-Pt)$_4$ | Ta(C$_2$H$_5$O)(C$_3$H$_7$O)$_4$ | Solid | 154 | 130-240 | 270 | THF(C$_4$H$_8$O) |

FIG. 3

| Precursor | Ta(OEt)(O-iso-Pt) | Ti(O-iso-Pt)$_2$(DPM)$_2$ |
|---|---|---|
| Precursor flow rate | 0.1cc/min | 0.1cc/min |
| Vaporizer Temperature | 200°C | 200°C |
| Ar carrier gas flow rate | 100sccm | 100sccm |
| Oxygen flow rate | 300sccm | |
| Heating line temperature | 180°C | |
| Substrate temperature | 390°C | |
| Total pressure | 1 torr | |

| | Temperature (°C) | | Time(sec) | Effective dielectric constant |
|---|---|---|---|---|
| Before thermal treatment (as deposited) | | | | 31.2 |
| One-step thermal treatment | RTO 750 | | 60 | 41.5 |
| | | | 120 | 39.4 |
| | RTO 800 | | 60 | 46.7 |
| | | | 120 | 42.6 |
| | RTO 850 | | 60 | 42.7 |
| | | | 120 | 36.8(Recipe A) |
| Two-step thermal treatment | 500°C RTO 5 min | RTO 750 | 30 | 43.2 |
| | | | 60 | 39.8 |
| | | RTO 800 | 30 | 48.9 |
| | | | 60 | 45.1 |
| | | RTO 850 | 30 | 46 |
| | | | 60 | 41.5(Recipe B) |
| Two-step thermal treatment | 600°C RTO 5 min | RTO 750 | 30 | 40.6 |
| | | | 60 | 38.5 |
| | | RTO 800 | 30 | 45.7 |
| | | | 60 | 41.4 |
| | | RTO 850 | 30 | 43.7 |
| | | | 60 | 38.8(Recipe C) |

FIG. 10

METHOD FOR FORMING A DIELECTRIC-CONSTANT-ENCHANCED CAPACITOR

This application is a continuation-in-part application of U.S. patent application Ser. No. 09/273,717, filed Mar. 22, 1999 now abandoned.

BACKGROUND OF THE INVENTION

1. Field of the Invention

The present invention is for the fabrication of a dielectric-constant-enhanced film, and a method of forming a capacitor of high dielectric constant.

2. Description of the Prior Art

High density dynamic random access memory (DRAM) requires using material with high dielectric constant ($\epsilon$) for adequate electrical charge storage in its size-limited capacitor unit. After the currently-in-use material, such as SiN ($\epsilon \sim 7$), the next manufacturable high-dielectric-constant material would be tantalum oxide which gives a dielectric constant of about 25 for 100 Å thick film in metal-insulator-metal (MIM) capacitor structure.

The methods for forming a thin film of tantalum oxide include a sputtering method, a chemical vapor deposition method, and an anodic oxide method for tantalum film. From these methods, the chemical vapor deposition method is superior to other methods in its conformality and thus in its production worthiness.

When tantalum oxide film is integrated as a metal-insulator-semiconductor (MIS) capacitor in DRAM, it gives an effective dielectric constant less than 14 for 100 Å films on silicon bottom electrode. This only gives improvement less than 30%, reducing the equivalent silicon oxide thickness from 40 to 28 angstroms. 30% improvement from tantalum oxide is useful for the very next generation technology after SiN era, but not good enough to last for the next two generation technology.

SUMMARY OF THE INVENTION

In accordance with the present invention, a method is provided for forming a capacitor device using $(Ta_2O_5)_{1-x}(TiO_2)_x$ thin film, wherein $0.05 \leq x \leq 0.15$. This $(Ta_2O_5)_{1-x}(TiO_2)_x$ film substantially increases dielectric constant, reduces leakage current and increases the integrity of integrated circuit. The dielectric constant is greatly improved by a factor of 2 to 3.5 when tantalum oxide is mixed with titanium oxide. The leakage current of this new material can be controlled to meet the requirement for DRAM cell by appropriate thermal treatment. This invention of dielectric-constant-enhanced thin film would prolong the usage of tantalum oxide based dielectric films in DRAM industry to 0.13 $\mu$m technology and beyond.

In one embodiment, one thin silicon nitride layer and one $(Ta_2O_5)_{1-x}(TiO_2)_x$ film with $0.05 \leq x \leq 0.15$ are formed on the bottom electrode. After the $(Ta_2O_5)_{1-x}(TiO_2)_x$ film is deposited, the treatments that can reduce the impurities and oxygen vacancies to reduce leakage current comprise the following techniques: plasma treatment, remote plasma treatment, rapid thermal process, UV/$O_3$ treatment and furnace treatment. The deposition of a metal layer on top of the thermally treated $(Ta_2O_5)_{1-x}(TiO_2)_x$ film, by physical vapor deposition or chemical vapor deposition, completes the method of the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 shows the chemical materials of the two precursors and the solvent they are mixed with.

DESCRIPTION OF THE PREFERRED EMBODIMENT

A specific embodiment of a high dielectric constant thin film according to the present invention will be described in detail with reference to accompanying drawings. An embodiment of the increased capacitance will be introduced first, and the fabrication and materials of dielectric thin film will be described next. The treatment that can reduce leakage current will be shown at last.

Figure 1:
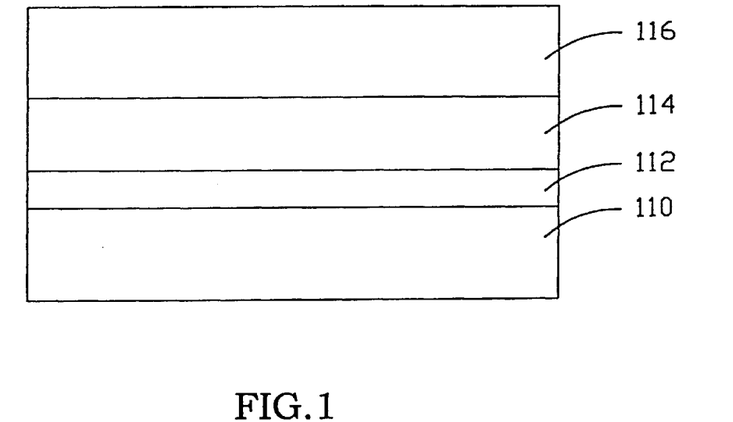
FIG. 1 is a schematic diagram showing the layer structure of the present invention for semiconductor memory device.

FIG. 1 is a schematic diagram showing the layer structure of the present invention for semiconductor memory device. The capacitor comprises a conductive layer 110 which is doped with an impurity polysilicon layer as the bottom electrode, a dielectric layer 112 that is silicon nitride, another dielectric layer 114 that is $(Ta_2O_5)_{1-x}(TiO_2)_x$ thin film with $0.05 \leq x \leq 0.15$, and a conductive layer 116 with tungsten, tungsten nitride, or titanium nitride as the top electrode.

On the surface of the doped polysilicon bottom electrode 110, a very thin layer 112 ($\sim$20 Å) of silicon nitride (SiN) is grown by either chemical vapor deposition technique using silane ($SiH_4$) or rapid thermal process in ammonia ($NH_3$) gas. The layer 112 of silicon nitride (SiN) is for minimizing the growth of silicon oxide ($SiO_2$) at the interface between doped polysilicon bottom electrode 110 and the $(Ta_2O_5)_{1-x}(TiO_2)_x$ thin film 114.

Figure 2:
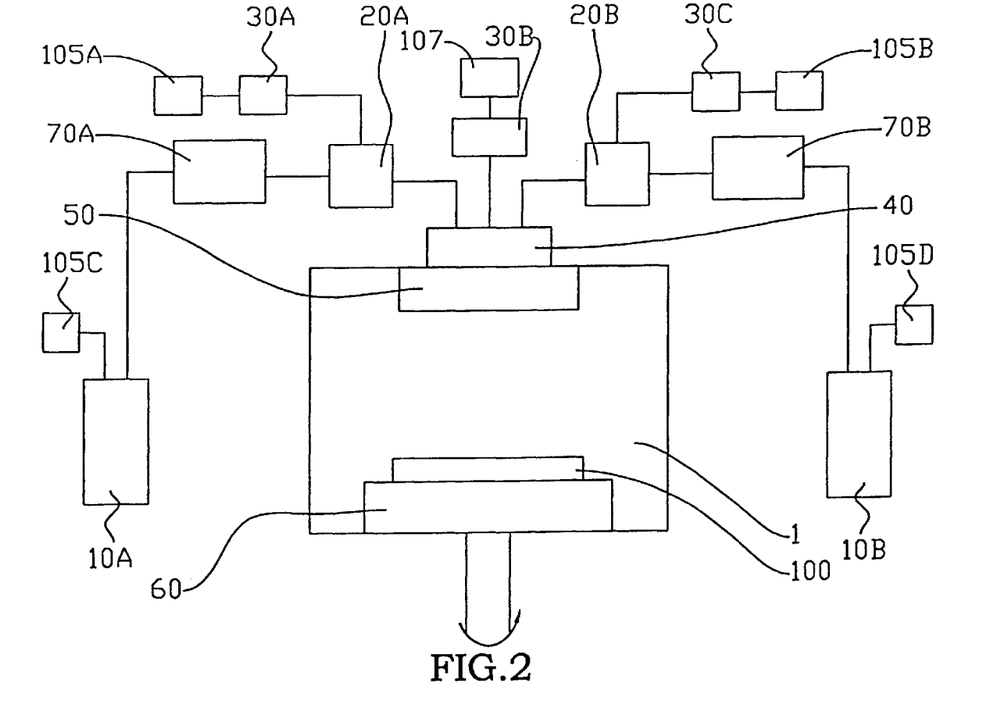
FIG. 2 is a schematic diagram employing an apparatus used in the manufacturing dielectric thin film method.

Subsequently, a thin layer of $(Ta_2O_5)_{1-x}(TiO_2)_x$ thin film 116 is deposited using chemical vapor deposition. FIG. 2 is a schematic diagram employing an apparatus used in the manufacturing dielectric thin film method. Two sets of liquid delivery system 10 are used to independently control the flow quantity of the two different precursors. These two different precursors are tantalum alkoxy ($Ta(OEt)(O-iso-Pt)_4$) and titanium ketones ($Ti(O-iso-Pr)_2(DPM)_2$). The chemical formula of the tantalum alkoxy is $Ta(C_2H_5O)(C_3H_7O)_4$ and the chemical formula of the titanium ketones is $Ti(C_3H_7O)_2(C_{11}H_{19}O_2)_2$. After the two precursors vaporized separately in two vaporizers 20, they are sent to the mixing box 40 right above the showerhead 50. The substrate 100 (wafer) sitting on the heater 60 in the reaction chamber 1 will then receive the vapor-phase-mixed chemical vapor. The chemical vapor for the deposition of a film composed of tantalum oxide and titanium oxide precursors, wherein the ratio of $TiO_2$ to $Ta_2O_5$ is in the range from 5 to 15 mole percent. Two sets of gas supply system 105 provide inert gas such as Ar that is used as carrier gas. Another gas supply system 107 provides oxygen that is used to assist the oxidation process during deposition. Two micropumps 70 are used in each liquid delivery system for accurate control of liquid flow. All mass flow controllers 30 are used to accurate control of liquid flow.

Figure 3:
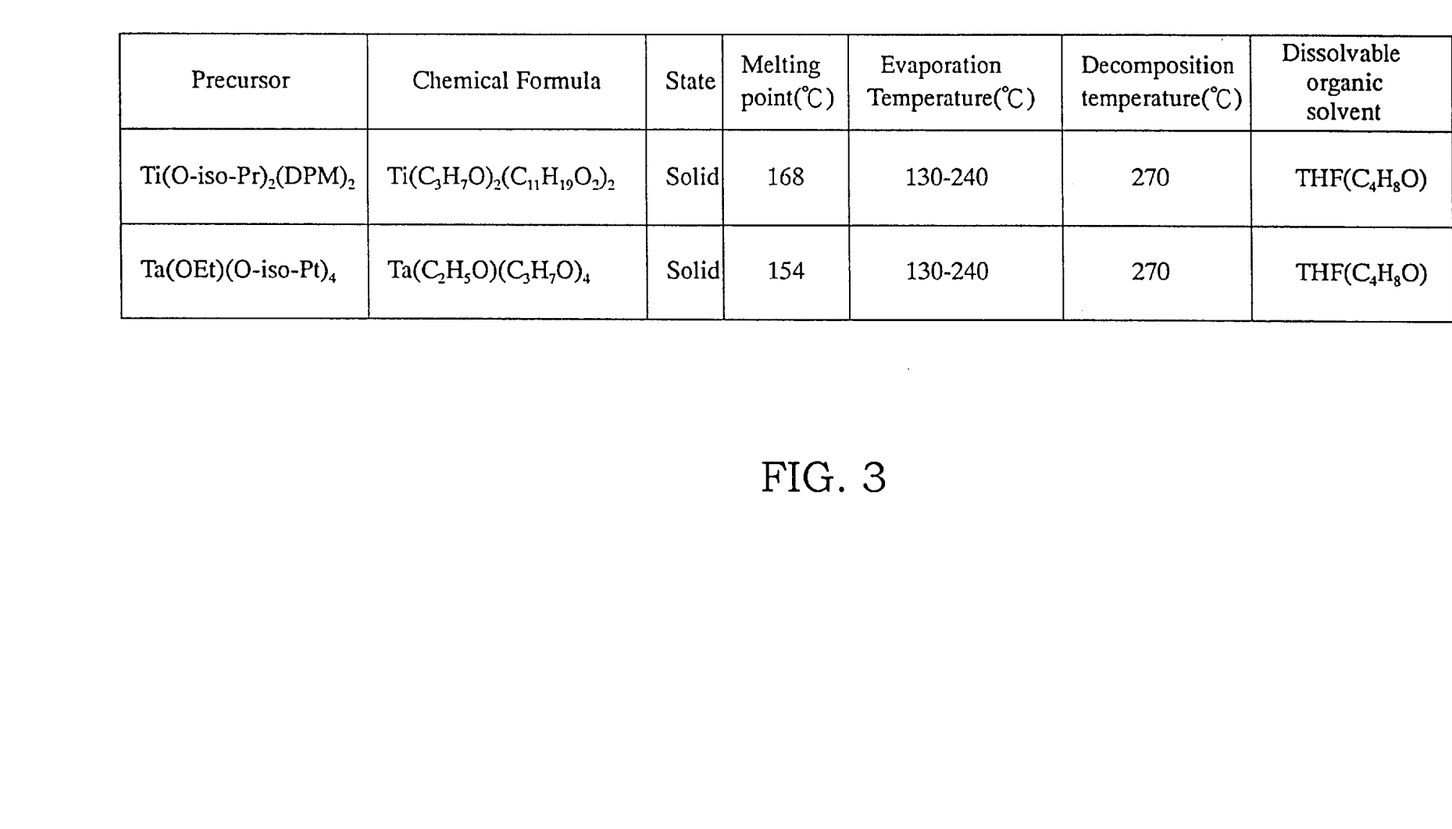

In FIG. 3, it shows the chemical materials and the solvent used for producing the two precursors. The chemical materials in the form of solid are dissolved in the solvent and become the form of liquid for easily controlling quantity. The vaporizing temperature and the decomposition temperature of precursors are also listed.

Figure 4:
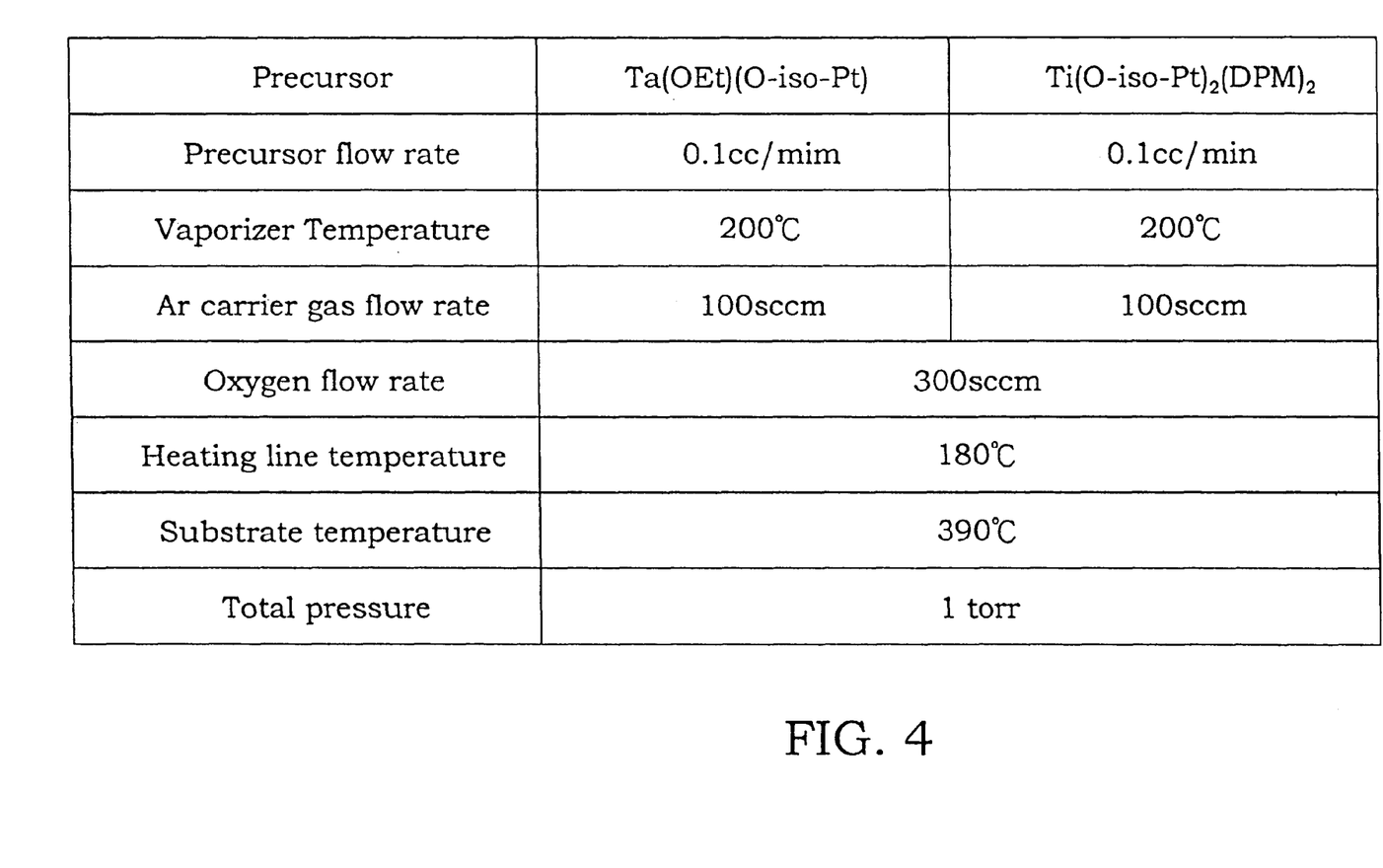
FIG. 4 shows the environment of fabricating the tantalum and titanium oxide film.

The above mentioned apparatus in FIG. 2 may be operated under the condition stated in FIG. 4 to produce tantalum oxide and titanium oxide films with the $TiO_2/Ta_2O_5$ ratio between 5 to 15 mole percent. According to the data shown in FIG. 4, the deposition of this embodiment is low pressure chemical vapor deposition.

Figure 5:
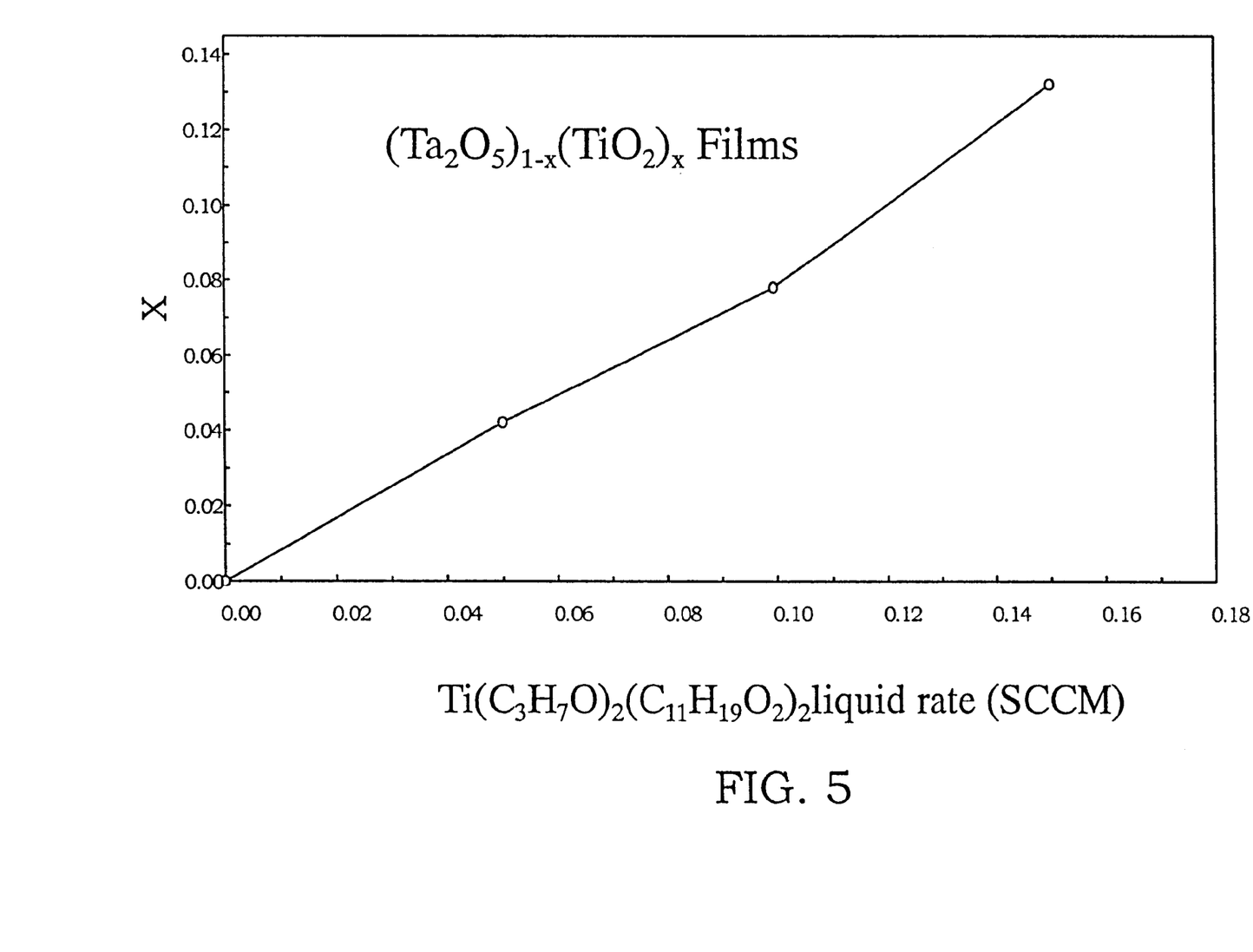
FIG. 5 shows that the ratio of Ti to Ta in the films can be controlled by the flow quantity of $Ti(O-iso-Pr)_2(DPM)_2$.

The ratio of Ti to Ta in the $(Ta_2O_5)_{1-x}(TiO_2)_x$ film can be controlled by the flow quantity of $Ti(O-iso-Pr)_2(DPM)_2$, as is shown in FIG. 5. The composition range of the present invention is the range studied: $(TiO_2)/(Ta_2O_5)=5$ to 15 mole percent.

Although the as deposited $(Ta_2O_5)_{1-x}(TiO_2)_x$ film with $0.05 \leq x \leq 0.15$ gives high dielectric constant, it also gives high leakage current. It is thus necessary to develop various treatments for this particular film in order to reduce the leakage current to a level that is acceptable for memory device such as DRAM.

The treatment recipes in the method of present invention is applied to the $(Ta_2O_5)_{1-x}(TiO_2)_x$ film before the deposition of conductive layer 116, and it can be described in two categories: (a) for reducing film impurities due to the incomplete decomposition of the precursors, and (b) for decreasing the oxygen vacancies in the film. The techniques used for (a) and (b) include plasma treatment, remote plasma treatment, rapid thermal process, $UV/O_3$ treatment and furnace treatment. The treatments using these techniques at low and high temperatures (range from 300° C.–1000° C.) give the effects listed in (a) and (b).

The treatments for the category (a) and (b) can be carried out in one or two steps (in different temperatures) using one of the above techniques, and it can also be carried out in two or three steps using more than one of the above techniques. The electrical performance data shown here is from one-step and two-step recipes using rapid thermal process technique.

Figure 6:
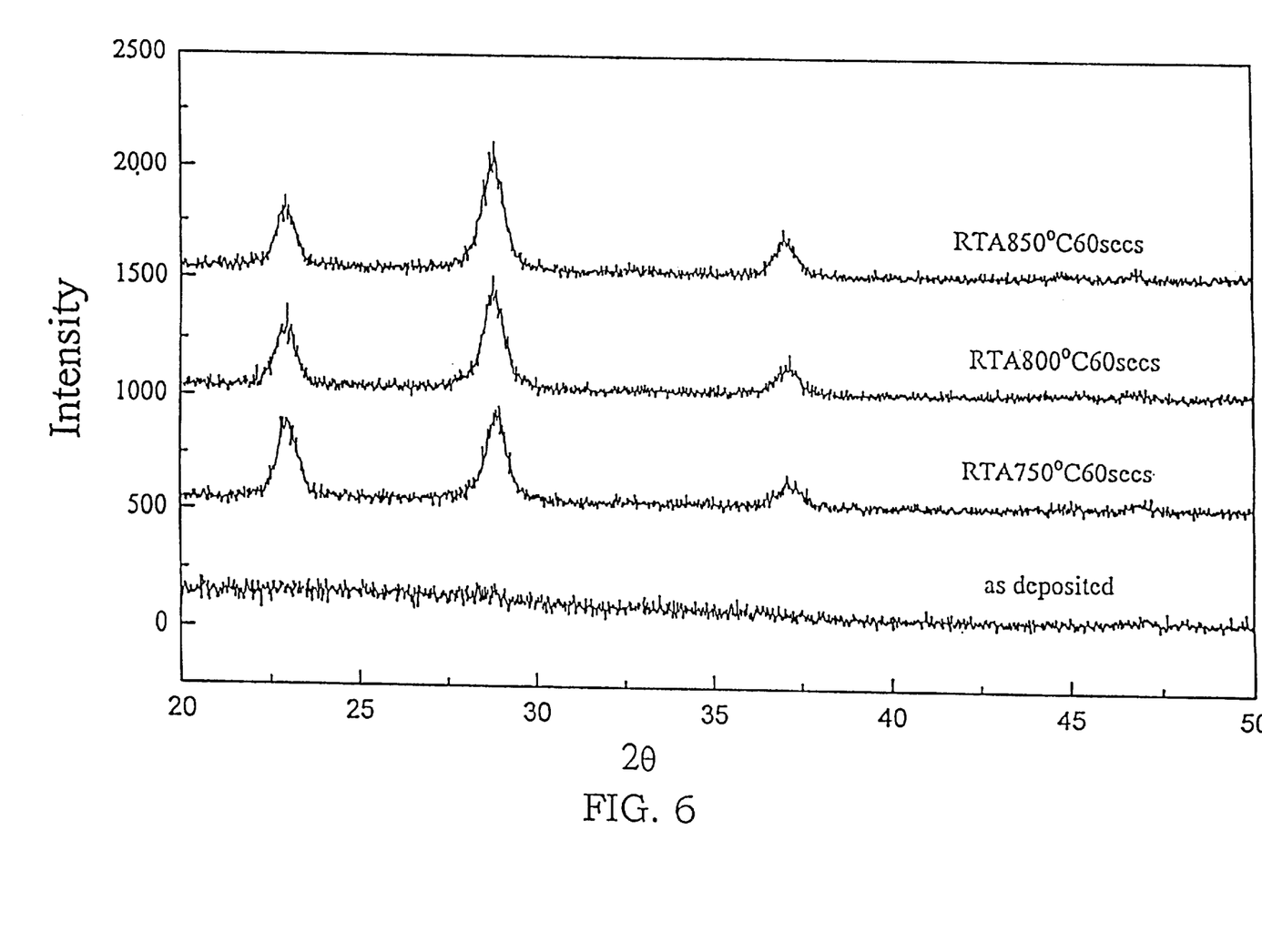
FIG. 6 shows the x-ray diffraction data for the $(Ta_2O_5)_{1-x}(TiO_2)_x$ film.
Figure 7:
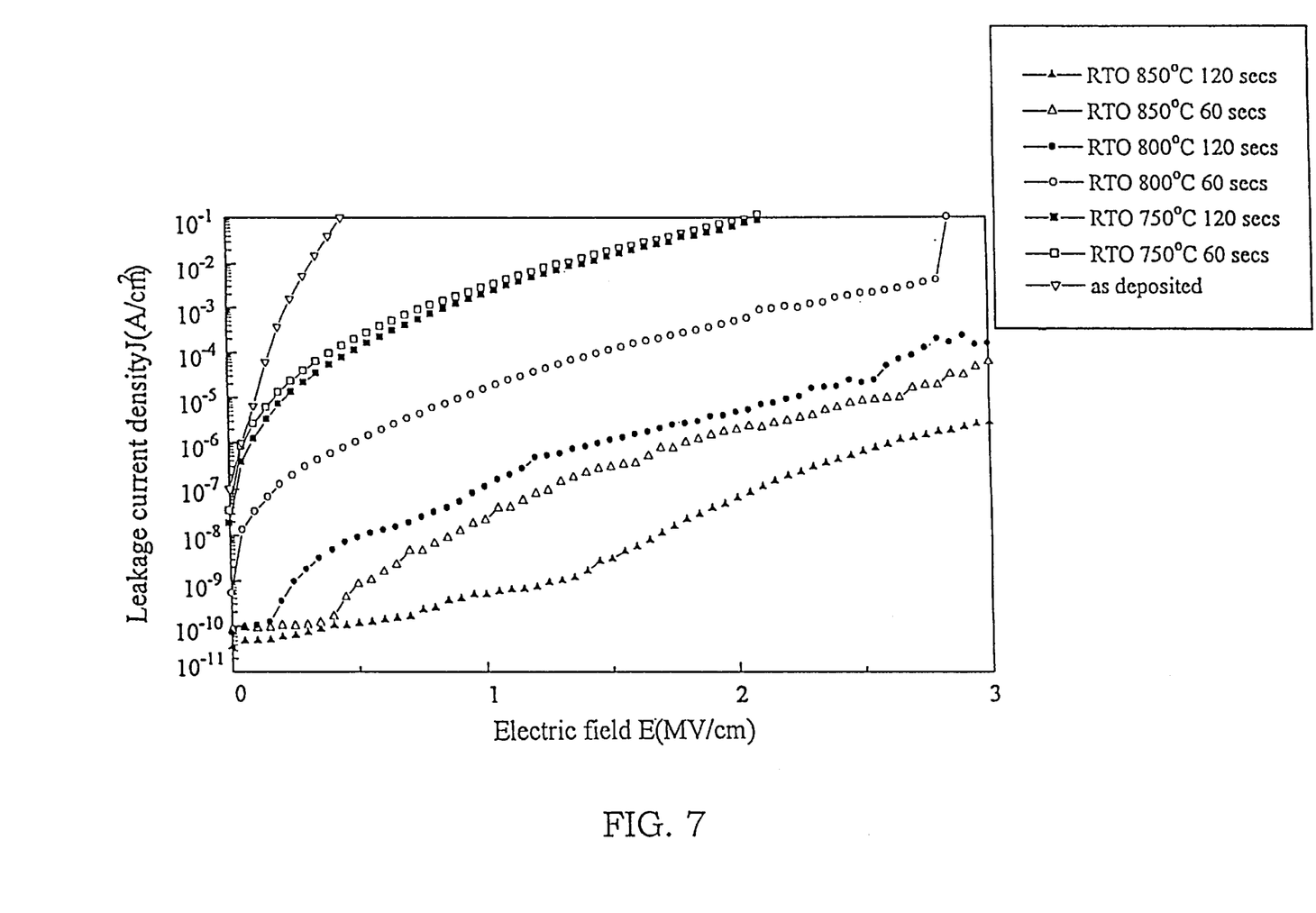
FIG. 7 shows a set of results using rapid thermal process.

The one-step thermal treatment uses a single thermal cycle at high temperature fulfilled $O_2$ or $N_2O$ gas in order to reduce the leakage current by reducing the impurity level of carbon and the vacancies of oxygen atoms. During this treatment, the phase of film will transform from amorphous to crystalline if the temperature applied is above 750° C. FIG. 6 shows the x-ray diffraction data for the thin dielectric film of the present invention. The film deposited at about 400° C. changes from amorphous state to crystalline state at temperature of 750° C. FIG. 7 shows a set of results using rapid thermal process technique and will be recipe A. The recipe A of using RTP in $O_2$ gas for 120 seconds gives a leakage current below $1E-8A/cm^2$ at 1.5 MV/cm.

Figure 8:
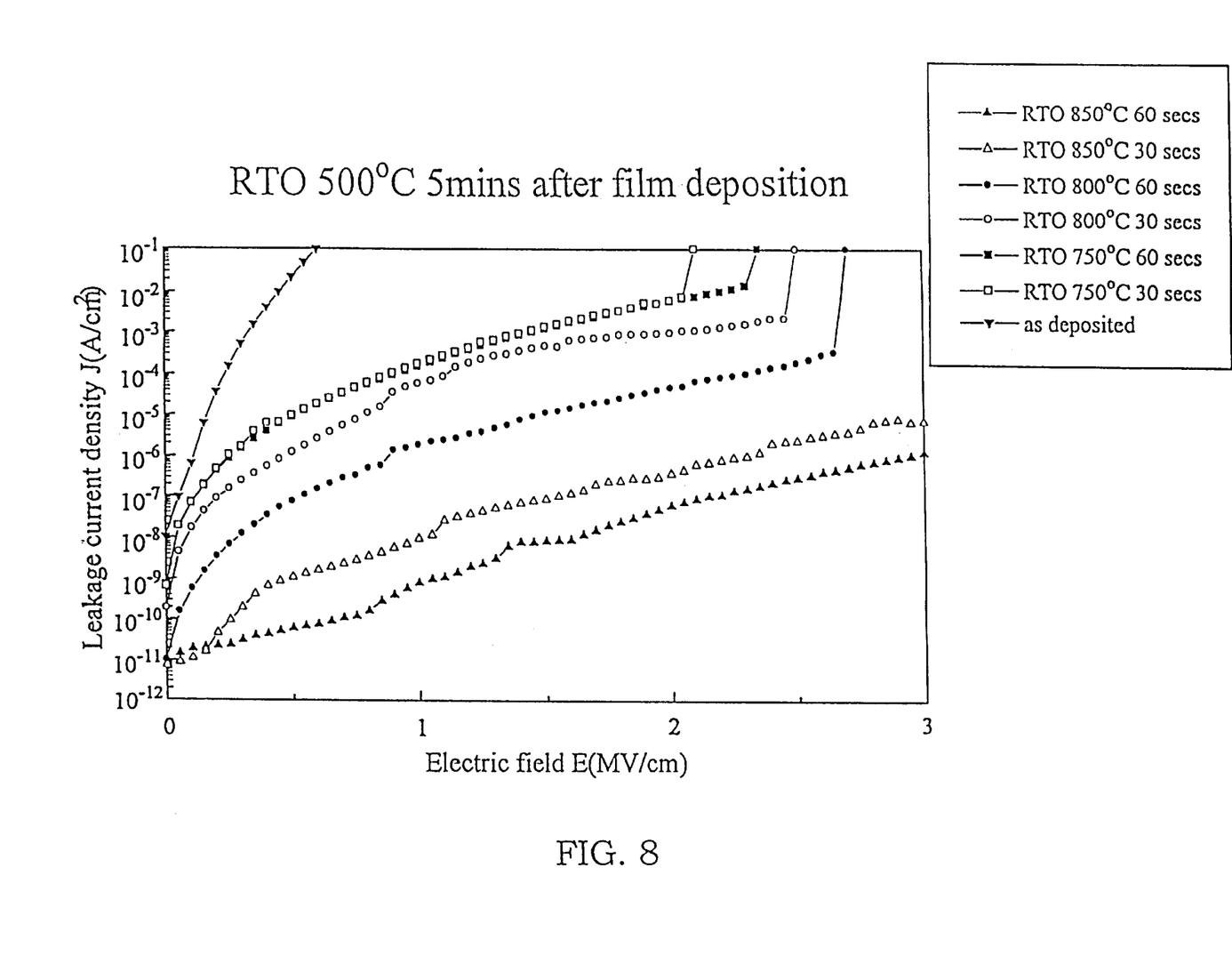
FIG. 8 and FIG. 9 each show a set of results obtained from two-step thermal treatment using rapid thermal process technique.
Figure 9:
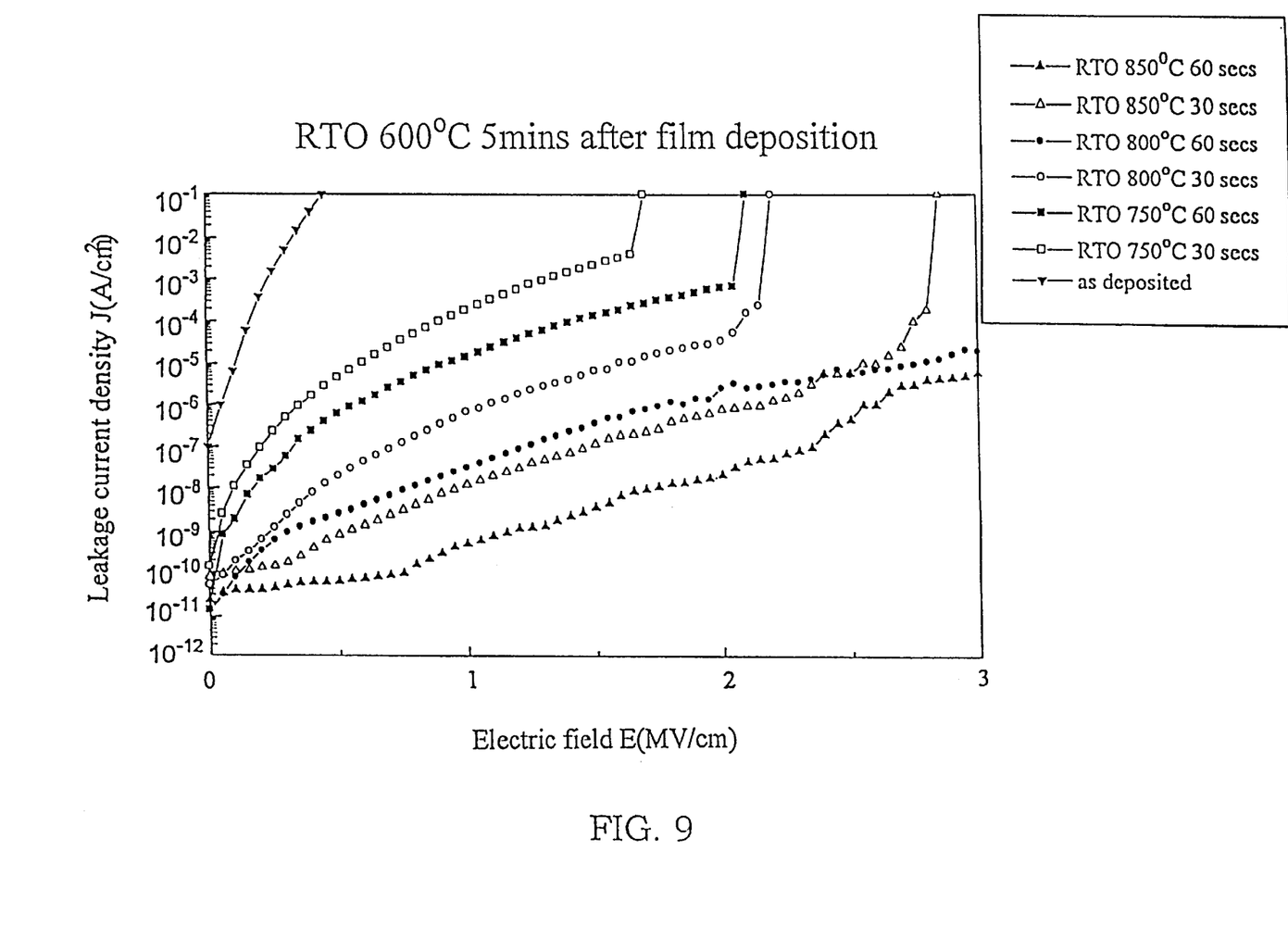

The two-step thermal treatment uses a low temperature cycle to treat the film for the reduction of impurities and oxygen vacancies before any amorphous-to-crystalline phase transformation, and subsequently uses a high temperature cycle to further reduce the impurity level and oxygen vacancies during crystallization process. FIG. 8 and FIG. 9 each show a set of results obtained from two-step thermal treatment using rapid thermal process technique and will be recipe B and C respectively. For the data shown in FIG. 8 and FIG. 9, the $(Ta_2O_5)_{1-x}(TiO_2)_x$ films with $x=0.078$ are subjected to the first thermal treatment using rapid thermal process technique in $O_2$ for 5 minutes at 500° C. and 600° C., respectively. In both cases, the using of rapid thermal process technique in $O_2$ gas at 850° C. for 60 seconds as the second thermal step gives a leakage current below $1E-8A/cm^2$ at 1.5 MV/cm.

The deposition of a metal layer 116 on top of the thermally treated $(Ta_2O_5)_{1-x}(TiO_2)_x$ film, by PVD or CVD, completes the method of the present invention. In this embodiment, the metal can be titanium nitride (TiN), tungsten nitride (WN), or tungsten (W).

Figure 10:
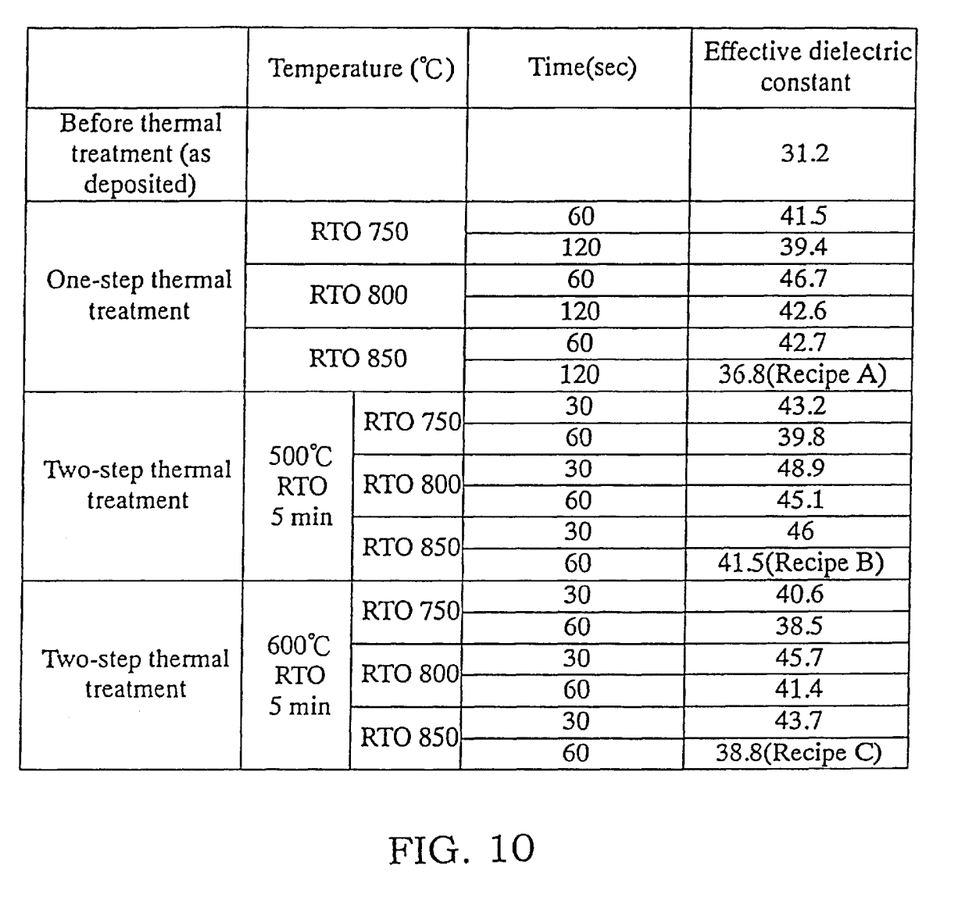
FIG. 10 shows the effective dielectric constant for the capacitors produced using the method of the present invention.

FIG. 10 gives a table showing the effective dielectric constant for the capacitors produced using the method of the present invention. For the recipes A, B and C giving leakage currents below $1E-8A/cm^2$ at 1.5 MV/cm (as is described above), the effective dielectric constants are still as high as 36.8, 41.5 and 38.8, respectively. These would give a $SiO_2$ equivalent thickness of about 10 Å for a capacitor produced in this method employing a 100 $(Ta_2O_5)_{1-x}(TiO_2)_x$ film with $x=0.078$.

Although specific embodiments have been illustrated and described, it will be obvious to those skilled in the art that various modifications may be made without departing from what is intended to be limited solely by the appended claims.

What is claimed is:

1. A method for forming a dielectric-constant-enhanced capacitor comprising:
    providing a wafer in a reaction chamber, wherein said wafer comprises a first conductive layer;
    forming a first dielectric layer above said first conductive layer to prevent said first conductive layer form growing silicon oxide and to diminish leakage current;
    transmitting a precursor to a vaporizer;
    transforming said precursor to a gas and transmitting said gas to said reaction chamber;
    depositing a second dielectric layer above said first dielectric layer;
    proceeding a heat treatment; and
    forming a second conductive layer on said second dielectric layer.

2. The method according to claim 1, wherein said precursor comprises a tantalum alkoxy.

3. The method according to claim 2, wherein said tantalum alkoxy is $Ta(C_2H_5O)(C_3H_7O)_4$.

4. The method according to claim 1, wherein said precursor comprises a titanium ketones.

5. The method according to claim 4, wherein said titanium ketones is $Ti(C_3H_7O)_2(C_{11}H_{19}O_2)_2$.

6. The method according to claim 1, wherein said heat treatment is a plasma treatment.

7. The method according to claim 1, wherein said heat treatment is a rapid thermal process.

8. The method according to claim 1, wherein said heat treatment is $UV/O_3$ treatment.

9. A method for forming a dielectric-constant-enhanced capacitor comprising:
    providing a wafer in a reaction chamber, wherein said wafer comprises a first conductive layer;
    forming a first dielectric layer above said first conductive layer to prevent said first conductive layer form growing silicon oxide and to diminish leakage current;

transmitting a precursor to a vaporizer, wherein said precursor comprises a tantalum alkoxy and a titanium ketones;

transforming said precursor to a gas, mixing said gas, and transmitting said gas to said reaction chamber;

depositing a second dielectric layer above said first dielectric layer;

proceeding a heat treatment; and forming a second conductive layer on said second dielectric layer.

10. The method according to claim 9, wherein said tantalum alkoxy is $Ta(C_2H_5O)(C_3H_7O)_4$.

11. The method according to claim 9, wherein said titanium ketones is $Ti(C_3H_7O)_2(C_{11}H_{19}O_2)_2$.

12. The method according to claim 9, wherein said heat treatment is a plasma treatment.

13. The method according to claim 9, wherein said heat treatment is a rapid thermal process.

14. The method according to claim 9, wherein said heat treatment is $UV/O_3$ treatment.

15. A method for forming a dielectric-constant-enhanced capacitor comprising:

providing a wafer in a reaction chamber, wherein said wafer comprises a first conductive layer;

forming a first dielectric layer above said first conductive layer to prevent said first conductive layer form growing silicon oxide and to diminish leakage current;

transmitting a tantalum alkoxy and a titanium ketones to a vaporizer to be a precursor;

transforming said tantalum alkoxy and said titanium ketones to a gas state and mixing said tantalum alkoxy and said titanium ketones to become a mixed gas;

transmitting said mixed gas to said reaction chamber;

depositing a second dielectric layer above said first dielectric layer by using said mixed gas, wherein a ratio of Ti to Ta is in the range from 5 to 15 mole percent in said second dielectric;

proceeding a first heat treatment;

proceeding a second heat treatment; and forming a second conductive layer on said second dielectric layer.

16. The method according to claim 15, wherein said tantalum alkoxy is $Ta(C_2H_5O)(C_3H_7O)_4$.

17. The method according to claim 15, wherein said titanium ketones is $Ti(C_3H_7O)_2(C_{11}H_{19}O_2)_2$.

18. The method according to claim 15, wherein said first heat treatment is a rapid thermal process.

19. The method according to claim 18, wherein a time of said rapid thermal process is about five minutes.

20. The method according to claim 15, wherein said second heat treatment is a plasma treatment.

* * * * *